United States Patent [19]

Shinohara et al.

[11] Patent Number: 4,672,152
[45] Date of Patent: Jun. 9, 1987

[54] MULTILAYER CERAMIC CIRCUIT BOARD

[75] Inventors: Hiroichi Shinohara; Nobuyuki Ushifusa, both of Hitachi; Kousei Nagayama, Toukai; Satoru Ogihara, Hitachi, all of Japan

[73] Assignee: Hitachi, Ltd., Tokyo, Japan

[21] Appl. No.: 888,410

[22] Filed: Jul. 23, 1986

[30] Foreign Application Priority Data

Aug. 5, 1985 [JP] Japan .................. 60-171080

[51] Int. Cl.⁴ .................................................. H05K 1/03
[52] U.S. Cl. ........................... 174/68.5; 361/414; 428/210; 428/901; 501/69
[58] Field of Search ............... 174/68.5; 361/414; 501/69; 428/209, 210, 901

[56] References Cited

U.S. PATENT DOCUMENTS

| | | | |
|---|---|---|---|
| 3,726,002 | 4/1973 | Greenstein et al. | 174/68.5 X |
| 3,841,950 | 10/1974 | Planchock et al. | 501/69 X |
| 4,135,038 | 1/1979 | Takami et al. | 428/901 X |
| 4,192,665 | 3/1980 | Chyung et al. | 501/69 X |
| 4,192,688 | 3/1980 | Babcock et al. | 501/69 X |
| 4,301,324 | 11/1981 | Kumar et al. | 174/68.5 |
| 4,313,026 | 1/1982 | Yamada et al. | 174/68.5 |
| 4,490,429 | 12/1984 | Tosaki et al. | 428/210 X |
| 4,547,625 | 10/1985 | Tasaki et al. | 361/414 X |
| 4,598,167 | 7/1986 | Ushifusa et al. | 174/68.5 |
| 4,620,264 | 10/1986 | Ushifusa et al. | 361/414 |

Primary Examiner—R. R. Kucia
Attorney, Agent, or Firm—Antonelli, Terry & Wands

[57] ABSTRACT

A ceramic insulating layer (2) for the multilayer ceramic circuit board (11) consists of 60 wt % of crystallized glass and 40 wt % of a filler such as silicon dioxide bonded by the crystallized glass, which consists of 6-15 wt % of lithium oxide, 70-90 wt % of silicon dioxide, 1-8 wt % of aluminum oxide, 1-5 wt % of alkaline metal oxide other than lithium oxide and 2-5 wt % of alkaline earth metal oxide. The sintered ceramic insulating layer (2) has a dielectric constant below 6.1 and a flexural strength above 150 MPa and is co-firable with a wiring conductor layer of such as gold, silver and copper.

6 Claims, 4 Drawing Figures

MULTILAYER CERAMIC CIRCUIT BOARD

The present invention relates to a multilayer ceramic circuit board and, more particularly, to a multilayer ceramic circuit board suitable for attachment of pins for input and output of electrical signals and mounting of semiconductor components so as to constitute a functional module.

BACKGROUND OF THE INVENTION

Recently multilayer ceramic circuit board have come into use for mounting integrated circuits such as an LSI in order to reduce delay of an electrical signal propagation time.

Conventionally, alumina is generally used as an insulating material for a multilayer ceramic circuit board. However one of the problems of the alumina multilayer ceramic circuit board is that the delay of signal propagation speed is large because the dielectric constant of alumina is as large as about 10 (at 1 MHz). Furthermore, the sintering temperature of alumina is so high as 1,600° C. that a high melting point metal such as tungsten or molybdenum has to be used as the wiring conductor material for the multilayer ceramic circuit board. However, since the electric resistivities of tungsten and molybdenum are comparatively high, these metals cannot be said to be satisfactory as a conductor material suitable for high densification of wiring conductors and speed up of electrical signal propagation speed.

Development of a multilayer ceramic circuit board for a high speed computer using an insulating material having a small dielectric constant is required in order to increase the signal propagation speed and further the multilayer ceramic circuit board is required to have a mechanical strength high enough to withstand the thermal stress produced during the attachment of pins or the like in order to increase reliability.

The use of a metal having a low electric resistivity such as gold, silver and copper is effective for lowering the wiring conductor resistance, but which requires a ceramic insulating material for the multilayer ceramic circuit board to be sintered at a temperature below the melting points of these metals.

In order to increase the electrical signal propagation speed as well as reliability of the multilayer ceramic circuit board, a multilayer ceramic circuit board has been studied and developed which uses an insulating material having a small dielectric constant and a metal material having a lower electric resistivity than tungsten and molybdenum such as gold, silver and copper, as a wiring conductor material.

Japanese Patent Laid-Open No. 11700/1984 or U.S. Patent Application Ser. No. 511,903, filed July 8, 1983 discloses a composite ceramic insulating material for a multilayer ceramic circuit board having a dielectric constant of 4.6–5.2 co-firable with the wiring conductor material such as gold, silver and copper, and consisting of silica and non-crystallized glass essentially consisting of 20–40 wt % of silicon dioxide, 10–20 wt % of aluminum oxide, 5–10 wt % of magnesium oxide and 30–60 wt % of boron oxide. However the mechanical strength of the sintered body formed of the above composite ceramic insulating material is not so high as that of alumina in that 41–53 MPa of flexural strength such that cracks at the sintered body and peeling of metallized layers from the sintered body may be caused due to thermal stress during attachment of pins for input and output to the multilayer ceramic circuit board, which reduces reliability and yield of the resultant product. The reason for the low mechanical strength of the sintered body formed of the above composite ceramic insulating material is considered to be the low mechanical strength of the non-crystallized glass which combines or binds the filler component, silica.

U.S. Pat. No. 4,301,324 discloses a glass-ceramic insulating material for a multilayer ceramic circuit board having a dielectric constant of 5.0–6.5 and a high rupture strength, co-firable with the wiring conductor material such as gold, silver and copper, and consisting solely of a glass ceramic or crystallized glass essentially consisting of 4.2–10 wt % of lithium oxide, 67.8–74.9 wt % of silicon dioxide and 7.5–16 wt % of aluminum oxide. The dielectric constant of the sintered body formed of the above glass ceramic insulating material is comparatively high because of small amount of silicon dioxide contained therein and further a dimensional stability of the sintered body is comparatively low because the sintered body is formed of a sole component, the crystallized glass.

SUMMARY OF THE INVENTION

One object of the present invention is to provide a composite ceramic insulating layer for a multilayer ceramic circuit board having a low dielectric constant below 6.1 and a high mechanical strenght above 150 MPa flexural strength and co-firable with wiring conductors such as gold, silver and copper for the multilayer ceramic circuit board.

Another object of the present invention is to provide a composite ceramic insulating layer for a multilayer ceramic circuit board having a high dimensional stability during sintering thereof.

The multilayer ceramic circuit board of the present invention is formed of a plurality of ceramic circuit board units laminated one after another, each including a ceramic insulating layer, a patterned electrical conductor layer such as gold, silver and copper supported on the ceramic insulating layer and through hole electrical conductors such as gold, silver and copper for connecting the patterned electrical conductor layers of the respective ceramic circuit board units to form a predetermined wiring circuit, the ceramic insulating layer consists of a crystallized glass or glass ceramic having a high mechanical strength and a filler having a small dielectric constant, the crystallized glass, which is non-crystallized state before heat treatment, combines or binds the filler during sintering thereof and is concurrently converted into crystallized glass which has a high mechanical strength.

The ceramic insulating layer essentially consists of 50–95 wt % of a crystallized glass and 5–50 wt % of a filler selected from the group of silicon dioxide, $\beta$-eucryptite and alunminum oxide. Preferably the ceramic insulating layer essentially consists of about 60 wt % of a crystallized glass and about 40 wt % of a filler.

The amount of filler powder to be added is restricted to 5–50% by weight because further addition of the filler lowers the flexural strength of a sintered body to less than 150 MPa, so that the sintered body may not withstand the thermal stress produced during attachment of pins or the like and less addition of the filler decreases the dimensional stability of the sintered body and further limits fly out of resins contained in the green sheet for the ceramic insulating layer during sintering.

The crystallized glass of the present invention, which functions as a binder with respect to the filler, essentially consists of 5-20 wt % of lithium oxide, 60-90 wt % of silicon dioxide, 1-10 wt % of aluminum oxide and 1-5 wt % of alkaline metal oxide other than lithium oxide such as sodium oxide, potassium oxide and cesium oxide.

Preferably the crystallized glass of the present invention essentially consists of 6-15 wt % of lithium oxide, 70-90 wt % of silicon dioxide, 1-8 wt % of aluminum oxide, 1-5 wt % of alkaline metal oxide other than lithium oxide, 2-5 wt % of alkaline earth metal oxide such as magnesium oxide, calcium oxide, barium oxide and strontium oxide and at least one selected from the group consisting of 3-13 wt % of boron oxide and 1-3 wt % of calcium fluoride.

The crystallized glass of the present invention containing the above specified ingredients is selected for its small dielectric constant and its low sintering temperature below the melting points of the wiring conductor such as gold, silver and copper used for the multilayer ceramic circuit board of the present invention.

The lithium oxide content in the crystallized glass is set in the range of 5 to 20 wt % because if it is less than 5 wt %, sintering at a temperature below 1,000° C. is impossible, while if it exceeds 20 wt %, the electrical properties such as dielectric constant and insulating property of the sintered ceramic insulating layer is unfavorably degenerated.

The silicon dioxide content in the crystallized glass is preferably 60 to 90 wt % so that the dielectric constant of the sintered ceramic insulating layer is lowered and the sintering temperature thereof is also lowered below 1,000° C.

The crystallized glass of the present invention is amorphous glass or non-crystallized glass before sintering, but after heat treatment crystals such as $Li_2O.2SiO_2$, $SiO_2$, $Li_2O.SiO_2$ and $LiO_2.Al_2O_3.n\ SiO_2$ (n=5 to 8) precipitated from the amorphous glass state.

In manufacturing a multilayer ceramic circuit board, it is necessary first to form a green body (a raw mold body). As such a method, doctor blade method, slip casting method, metal mold forming method using a press are known.

The doctor blade method is a method of forming a green sheet by means of a green sheet producing apparatus after adding a solvent and a thermoplastic resin and the like to a raw material powder and deaerating the stirred slurry.

The slip casting method is a method of forming a green sheet by adding water, a dispersing agent and a thermoplastic resin to a raw material powder, and pouring the stirred slurry into, for example, a gypsum mold.

The metal mold forming method using a press is a method of forming a green sheet by adding a solvent and a thermoplastic resin to a raw material powder, mixing and stirring it by an attrition mill or the like, granulating it through a sieve, pouring it into a mold, and pressing it.

Green bodies manufactured by one of the abovedescribed methods are stacked each other with one on top of another, deaerated and fired, whereby a multilayer ceramic circuit board is obtained.

DESCRIPTION OF THE PREFERRED EMBODIMENTS

Embodiments of the present invention will be explained in the following. Hereinunder, "part" means part by weight, and "%" means wt %.

(Embodiment 1)

In manufacturing a multilayer ceramic circuit board, a slurry for a green sheet was prepared by mixing a glass powder with a composition of 12.3% $Li_2O$, 79.3% $SiO_2$, 3.9% $Al_2O_3$, 2.4% $K_2O$, and 2.0% $CaF_2$ of 1 μm in average particle diameter with $SiO_2$ of 1 μm in average particle diameter in a predetermined mixture ratio shown in Table 1, adding to the mixture 5.9 parts of polyvinyl butyral of 4,000 in polymerization degree, 124 parts of trichloroethylene, 32 parts of tetrachloroethylene and 44 parts of n-butyl alcohol, and wet blending for 20 hours through a ball mill. The viscosity of the slurry was so controlled to be apporpriate by vacuum deaeration.

The glass used for combining $SiO_2$ of filler component in this embodiment was amorphous at the beginning, but after it was subjected to heat treatment, crystals were precipitated. When the precipitated crystals were examined by the X-ray diffraction method, they proved to be mainly $Li_2O.2SiO_2$ and $SiO_2$, and $Li_2O.SiO_2$, $K_2SiO_3$, $KAlSiO_4$ were also recognized.

When the glass alone was sintered, it produced the properties of 5.8 in dielectric constant and 210 MPa in flexural strength as seen from Table 1, which is much higher than a flexural strength 40 to 60 of a general amorphous glass, which proves that the crystallized glass of the present invention has a very high mechanical strength.

The slurry was next coated on a polyester film support, which was coated with silicone, in the thickness of 0.2 mm by using doctor blade, and dried to form a ceramic green sheet for a ceramic insulating layer.

The green sheet was next cut into 50 mm×50 mm, and those cut sheets which were stacked together in 30 layers were bonded by hot pressing at temperature of 120° C. and under a pressure of 30 kgf/mm².

After the press bonding, the heating temperature was elevated at a rate of less than 100° C./h to 500° C. and the laminate was heated at 500° C. for 3 hours for degreasing. Then the heating temperature was elevated to 930° to 980° C. at a rate of 200° C./h for sintering the laminate in the atmosphere.

Figure 1:
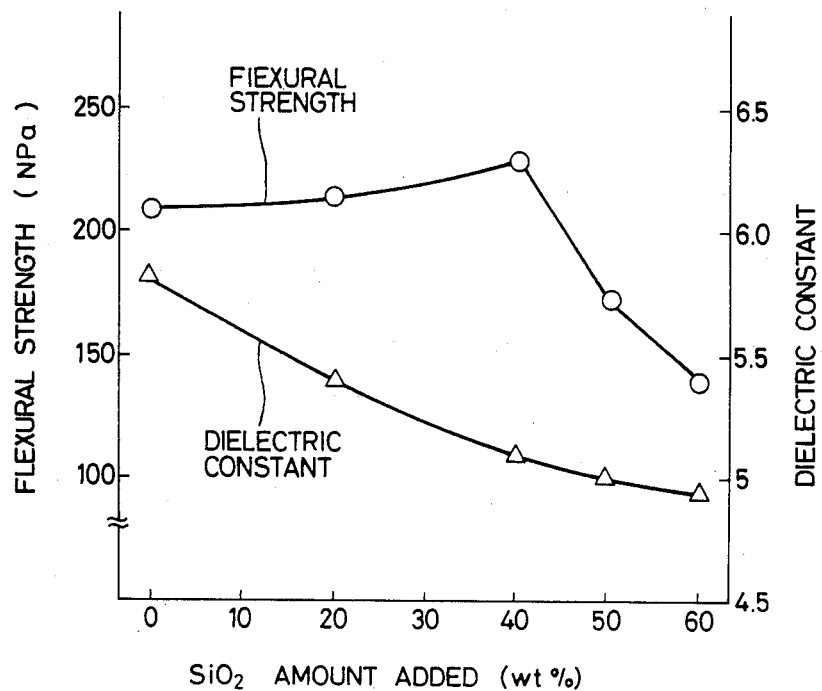
FIG. 1 is a curve which shows the relationship between the mixture ratio of $SiO_2$ in a composite ceramic insulating layer consisting of a crystallized glass and $SiO_2$ and the flexural strength and the dielectric constant of the sintered composite ceramic insulating layer.

FIG. 1 shows the relationship between the weight percentage of $SiO_2$ of the filler component and the flexural strength and dielectric constant of the sintered body with a change in mixture ratio of $SiO_2$ and the crystallized glass of the binder component specified in Table 1. The dielectric constant was measured at 1 MHz.

As a result of the X-ray diffraction analysis of the crystals constituting the sintered body, it was found that most of them were the crystals of $Li_2O.2SiO_2$ and $SiO_2$, and in addition, $Li_2O.SiO_2$, $K_2SiO_3$, $KAlSiO_4$ were also recognized, as same as those recognized when the glass alone was sintered as explained above.

Among the green sheets produced in the above method, green sheets mixture ratio of the glass powder and $SiO_2$ is 3:2 as seen from Table 1 were provided with holes of a diameter of 100 μm with a punch. A gold paste was embedded therein, an wiring conductor is formed with the gold paste on the green sheet. A multiplicity of such green sheets were stacked together and bonded by pressing, to obtain a multilayer ceramic circuit board. Thereafter, the heating temperature was elevated at a rate of less than 100° C./h to 500° C. for the removal of the resin, the laminate was heated at 500° C. for 3 hours, and then elevated at a rate of 200° C./h to sinter it at 960° C. in the atmosphere.

No cracking nor peeling was observed around the metallized gold wiring.

To the sintered body pins were then attached and semiconduator chips were mounted. No cracking or the like was recognized in the vicinity of the portions at which the pins and the semiconductor chips were attached or mounted. The dielectric constant of the sintered ceramic insulating layer thus produced in accordance with this embodiment was 5.1.

Figure 2:
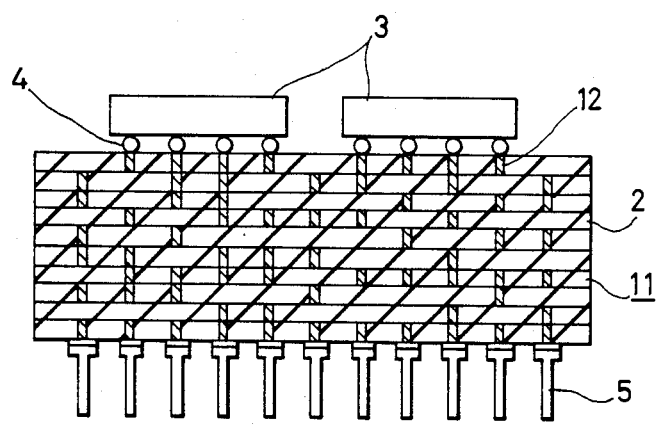
FIG. 2 is a schematic sectional view of one embodiment of the present invention.

FIG. 2 is a schematic cross sectional view of the multilayer ceramic circuit board thus produced, in that the multilayer ceramic circuit board 11 formed of a pluralily of ceramic circuit board units laminated one after another, each includes a ceramic insulating layer 2, a patterned electrical conductor layer (not shown) supported on the ceramic insulating layer 2 and through hole electrical conductors 12 for connecting the patterned electrical conductor layers of the respeetive ceramic circuit board units to form a predetermined wiring circuit. Semiconductor chips 3 are mounted on the multilayer ceramic circuit board 11 through solders 4 and also pins 5 for electrical signal input and output are connected to the multilayer ceramic circuit board 11.

(Embodiment 2)

The glass powder of the composition of 12.3% $Li_2O$, 79.3% $SiO_2$, 3.9% $Al_2O_3$, 2.4% $K_2O$ and 2.0% $CaF_2$, which is the same as in embodiment 1, was mixed with the filler powder in a predetermined mixture ratio as shown in Table 2 to form green sheets in the same way as in embodiment 1. The green sheets were stacked in layers and fired. The properties of the sintered bodies are shown in Table 2. $Al_2O_3$ and β-eucryptite were used as the filler. The frequency for measuring the dielectric constant was 1 MHz.

The green sheet composed of the glass powder and the filler powder was provided with wiring conductor of a gold paste in the same way as in embodiment 1, and thereafter a multiplicity of them were stacked in layers, bonded by pressing and fired at the firing temperatures of the respective materials in the atmosphere as shown in Table 2. No cracking nor peeling was observed around the metallized gold wiring.

To the sintered body pins were then attached and semiconductor chips were mounted. No cracking or the like was recognized in the vicinity of the portions at which the pins and the semiconductor chips were attached on mounted.

TABLE 2

| Type of Filler | Mixture Ratio (wt %) | | Properties | | |
|---|---|---|---|---|---|
| | Glass | Filler | Firing Temperature (°C.) | Flexural Strength MPa | Dielectric Constant |
| β-eucryptite | 80 | 20 | 970 | 190 | 6.1 |
| $Al_2O_3$ | 90 | 10 | 950 | 180 | 5.9 |
| $Al_2O_3$ | 95 | 5 | 940 | 195 | 5.8 |

(Embodiment 3)

The glass powder and the filler powder of the compositions shown in Table 3 were mixed in a predetermined ratio indicated to form a green sheet in the same way as in embodiment 1. The properties of the sintered bodies obtained by stacking and firing the green sheets produced in the some way as in embodiment 1 are shown in Table 3. The green sheet was provided with wiring conductor of a gold paste in the same way as in embodiment 1, and thereafter a multiplicity of them were stacked in layers, bonded by pressing and fired in the atmosphere. No cracking nor peeling was observed around the metallized gold wiring. To the sintered body pins were then attached and semiconductor chips were mounted. No cracking or the like was recognized in the vicinity of the portions at which the pins and the semiconductor chips were attached or mounted.

TABLE 1

| Glass Composition (wt %) | Mixture Ratio (wt %) | | Properties | | |
|---|---|---|---|---|---|
| | Glass | Filler $SiO_2$ | Firing temperature (°C.) | Dielectric Constant | Flexural Strength (MPa) |
| $Li_2O$(12.3)—$SiO_2$(79.3)—$Al_2O_3$ (3.9)—$K_2O$(2.4)—$CaF_2$(2.0) | 100 | — | 930 | 5.3 | 48 |
| | 80 | 20 | 940 | 4.9 | 50 |
| | 60 | 40 | 960 | 4.7 | 53 |
| | 40 | 60 | 980 | 4.4 | 46 |

TABLE 3

| No. | Glass Composition (wt %) | Mixture Ratio (wt %) | | Properties | | |
|---|---|---|---|---|---|---|
| | | Glass | Filler | Firing Temperature (°C.) | Flexural Strength (MPa) | Dielectric Constant (at 1 MHz) |
| 1 | $Li_2O$(10-15)—$SiO_2$(75-85)—$Al_2O_3$(1-8)—$K_2O$(1-5)—$CaF_2$(1-3) | 100 | — | 920~960 | 160~220 | 5.6~6.0 |
| | | 60 | $SiO_2$ 40 | 950~1000 | 170~230 | 4.9~5.4 |
| 2 | $Li_2O$(6)—$SiO_2$(88)—$Al_2O_3$(2)—$K_2O$(2)—CaO(2) | 100 | — | 980 | 170 | 5.1 |
| 3 | $Li_2O$(12.0)—$SiO_2$(77)—$Al_2O_3$(3.8)—$K_2O$(2.4)—MgO(2.8)—$CaF_2$(2.0) | 60 | $SiO_2$ 40 | 920 | 160 | 5.2 |
| | | 90 | $Al_2O_3$ 10 | 930 | 150 | 5.8 |

TABLE 3-continued

| No. | Glass Composition (wt %) | Mixture Ratio (wt %) Glass | Mixture Ratio (wt %) Filler | Firing Temperature (°C.) | Flexural Strength (MPa) | Dielectric Constant (at 1 MHz) |
|---|---|---|---|---|---|---|
| 4 | $Li_2O(9)$—$SiO_2(70)$—$Al_2O_3(3)$—$K_2O(1)$—$MgO(2)$—$CaO(2)$—$B_2O_3(13)$ | 100 60 | — $SiO_2$ 40 | 880 910 | 160 170 | 6.0 5.4 |
| 5 | $Li_2O(10)$—$SiO_2(81)$—$Al_2O_3(4)$—$Na_2O(5)$ | 100 60 | — $SiO_2$ 40 | 930 960 | 200 210 | 5.8 5.1 |
| 6 | $Li_2O(9)$—$SiO_2(75)$—$Al_2O_3(6)$—$K_2O(2)$—$MgO(4)$—$B_2O_3(4)$ | 100 50 | — $SiO_2$ 50 | 920 950 | 170 160 | 5.9 5.2 |
| 7 | $Li_2O(10)$—$SiO_2(80)$—$Al_2O_3(5)$—$CsO(5)$ | 60 | $SiO_2$ 40 | 950 | 210 | 5.2 |
| 8 | $Li_2O(12)$—$SiO_2(73)$—$Al_2O_3(6)$—$K_2O(2)$—$MgO(2)$—$B_2O_3(3)$—$CaF_2(2)$ | 100 60 | — $SiO_2$ 40 | 880 940 | 180 200 | 5.8 5.1 |
| 9 | $Li_2O(8)$—$SiO_2(78)$—$Al_2O_3(8)$—$K_2O(2)$—$MgO(4)$ | 100 60 | — $SiO_2$ 40 | 940 980 | 170 160 | 6.1 5.4 |
| 10 | $Li_2O(12)$—$SiO_2(76)$—$Al_2O_3(3)$—$K_2O(3)$—$BaO(4)$—$CaF_2(2)$ | 100 60 | — $SiO_2$ 40 | 900 940 | 180 200 | 5.7 5.2 |
| 11 | $Li_2O(10)$—$SiO_2(74)$—$Al_2O_3(6)$—$K_2O(2)$—$CaO_3$—$SrO(5)$ | 100 60 | — $SiO_2$ 40 | 880 940 | 190 210 | 5.9 5.2 |
| 12 | $Li_2O(13)$—$SiO_2(74)$—$Al_2O_3(4)$—$K_2O(4)$—$CaO(5)$ | 100 60 | — $SiO_2$ 40 | 900 950 | 180 190 | 5.8 5.3 |

(Embodiment 4)

The glass powder and the filler powder of the same compositions as those used in embodiments 1 and 3 were mixed with $SiO_2$ powder of filler in the mixture ratio of 3:2, and to the mixture were added a solvent and a methacrylic acid group resin which exhibits a good flying characteristic in nitrogen gas, thereby producing a green sheet in the same way as in embodiment 1. Copper paste was printed on the green sheet and a multiplicity of the green sheets were stacked in layers, fired in the nitrogen atmosphere to obtain a multilayer ceramic circuit board with the copper wiring conductor provided therewith. No cracking nor peeling was observed around the metallized copper wiring. To the sintered body pins were then attached and semiconductor chips were mounted. No cracking or the like was recognized in the vicinity of the portions at which the pins and the semiconductor chips were attached or mounted.

(Embodiment 5)

Figure 3:
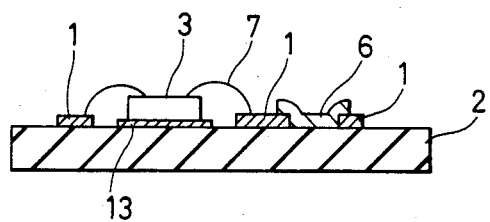
FIG. 3 is a schematic sectional view of another embodiment of the present invention.

The green sheets produced in accordance with embodiment 1, 2, 3 or 4 were stacked in 10 to 20 layers and bonded by pressing. On the laminated product an gold, silver and copper conductor pastes and a resistor paste, and a passivating glass were printed, and they were co-fired at a temperature below 1,000° C. Further integrated circuit (IC) chips or the like were mounted on the sintered body to produce a hybrid IC for a general use. FIG. 3 is a schematic sectional view of the hydrid IC thus produced in that metallized conductor layers 1 and resistor layer 6 are formed on the ceramic insulating layer or substrate 2 produced in accordance with the present embodiment. A semiconductor chip 3 is mounted through a bonding layer 13 on the ceramic insulating substrate 2. The semiconductor chip 3 and the conductor layer 1 are electrically connected to form a predetermined hybrid IC.

(Embodiment 6)

Figure 4:
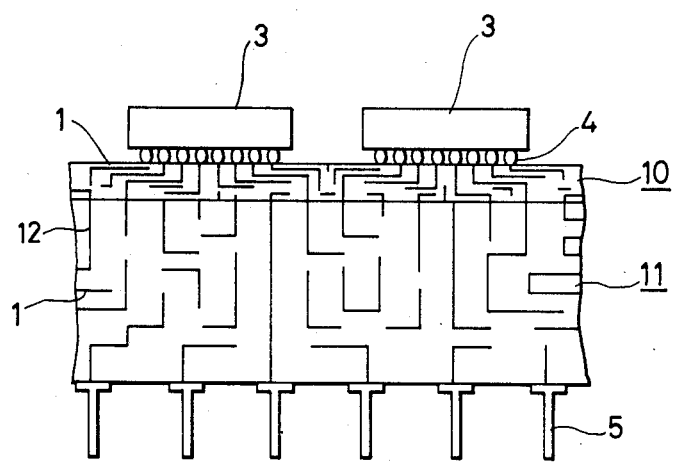
FIG. 4 is a schematic sectional view of still further embodiment of the present invention.

On a multilayer ceramic circuit board which was produced in accordance with embodiment 1, 2, 3 and 4 a multilayer circuit using copper as wiring conductors and polyimide as their insulators was formed. Silicon semiconductor chips are mounted on the copper-polyimide multilayer circuit board with a high precision. Pins for electrical signal input and output are attached to the multilayer ceramic circuit board. A module thus produced is schematically shown in FIG. 4, in which the same numerals as in the previous embodiments indicate the same or equivalent parts therein. Since a copper-polyimide multilayer circuit board 10 is formed through etching technique a very good dimensional precison and a very fine wiring are obtained which facilitates a high precision connection with the silicon semiconductor chips. No cracking or the like was recognized in the vicinity of the portions at which the pins 5 were attached. No cracking or the like also was not recognized at the connecting solder parts 4 between the semiconductor chips 3 and the copper-polyimide multilayer circuit board 10. Further adhesion between the multilayer ceramic circuit board 11 and the copper-polyimide multilayer circuit board 10 was good.

In the previous embodiments the pins were brazed by a silver solder and the silicon simiconductor chips were bonded by a Pb-Sn solder. The high mechanical strength of the board material enabled the brazing of the pins and the soldering of the silicon semiconductor chips.

According to the present invention, by the use of a composite material consisting of a crystallized glass powder mainly containing lithium oxide and silicon dioxide and a filler powder produces a sintered ceramic insulating layer which has a dielectric constant as small as 6.1 and a high mechanical strength, and is further cofirable at a temperature below the melting points of a metal such a gold, silver and copper.

We claim:

1. A multilayer ceramic circuit board (11) formed of a plurarity of ceramic circuit board units laminated one after another, each unit including a ceramic insulating layer (2), a patterned electral conductor layer (1) supported on said ceramic insulating layer (2) and through hole electrical conductors (12) for connecting said patterned electrical conductor layers (1) of said respective ceramic circuit board units to form a predetermined wiring circuit, said electrical conductor layers (1) and said through hole electrical conductors (12) essentially consisting of a metal selected from the group of copper, silver, gold and alloys thereof, characterized in that said ceramic insulating layer (2) essentially consists of 50–95 wt % of a crystallized glass and 5–50 wt % of a filler selected from the group of silicon dioxide, $\beta$-eucryptite and aluminum oxide, said crystallized glass essentially consists of 5–20 wt % of lithium oxide, 60–90 wt % of silicon dioxide, 1–10 wt % of aluminum oxide and 1–5 wt % of alkaline metal oxide other than lithium oxide and is concurrently converted to a crystallized state during sintering of said crystallized glass and said filler at a temperature below a melting temperature of said patterned electrical conductors and said through hole electrical conductors.

2. A multilayer ceramic circuit board according to claim 1 further characterized in that said ceramic insulating layers (2) essentially consist of about 60 wt % of said crystallized glass and about 40 wt % of said filler.

3. A multilayer ceramic circuit board according to claim 1 further characterized in that said crystallized glass essentially consists of 6–15 wt % of lithium oxide, 70–90 wt % of silicon dioxide, 1–8 wt % of aluminum oxide, 1–5 wt % of alkaline metal oxide other than lithium oxide and 2–5 wt % of alkaline earth metal oxide.

4. A multilayer ceramic circuit board according to claim 3 further characterized in that said ceramic insulating layers (2) essentially consist of about 60 wt % of said crystallized glass and about 40 wt % of said filler.

5. A multilayer ceramic circuit board according to claim 4 further characterized in that said crystallized glass essentially consists of 6–15 wt % of lithium oxide, 70–90 wt % of silicon dioxide, 1–8 wt % of aluminum oxide, 1–5 wt % of alkaline metal oxide other than lithium oxide, 2–5 wt % of alkaline earth metal oxide and at least one selected from the group consisting of 3–13 wt % of boron oxide and 1–3 wt % of calcium fluoride.

6. A ceramic insulating substrate (2) for mounting a hybrid intergrated circuit essentially consists of 50–95 wt % of a crystallized glass and 5–50 wt % of a filler selected from the group of silicon dioxide $\beta$-eucryptite and aluminum oxide, said crystallized glass essentially consists of 5–20 wt % of lithium oxide, 60–90 wt % of silicon dioxide, 1–10 wt % of aluminum oxide and 1–5 wt % of alkaline metal oxide other than lithium oxide and is converted to a crystallized state during sintering of said crystallized glass and said filler at a temperature below 1000° C.

* * * * *